US010458603B2

(12) United States Patent
Rijken et al.

(10) Patent No.: US 10,458,603 B2
(45) Date of Patent: Oct. 29, 2019

(54) TUBULAR LIGHTING ASSEMBLY WITH ELASTIC ELONGATED SUBSTRATE AND METHOD OF MANUFACTURING A TUBULAR LIGHTING ASSEMBLY WITH ELASTIC ELONGATED SUBSTRATE

(71) Applicant: SIGNIFY HOLDING B.V., Eindhoven (NL)

(72) Inventors: Antonius Maria Rijken, Eindhoven (NL); Erik Paul Boonekamp, Eindhoven (NL); Martinus Hermanus Wilhelmus Maria Van Delden, Eindhoven (NL); Henricus Johannes Joseph Bouwens, Eindhoven (NL); Giovanni Cennini, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 64 days.

(21) Appl. No.: 15/032,481

(22) PCT Filed: Oct. 22, 2014

(86) PCT No.: PCT/EP2014/072584
§ 371 (c)(1),
(2) Date: Apr. 27, 2016

(87) PCT Pub. No.: WO2015/067466
PCT Pub. Date: May 14, 2015

(65) Prior Publication Data
US 2016/0327215 A1 Nov. 10, 2016

(30) Foreign Application Priority Data

Nov. 5, 2013 (EP) ..................................... 13191507

(51) Int. Cl.
*F21K 9/278* (2016.01)
*F21K 9/27* (2016.01)
(Continued)

(52) U.S. Cl.
CPC ................ *F21K 9/278* (2016.08); *F21K 9/27* (2016.08); *F21K 9/90* (2013.01); *F21Y 2115/10* (2016.08);
(Continued)

(58) Field of Classification Search
CPC ... F21K 9/278; F21K 9/90; F21K 9/27; F21K 9/275; F21K 9/60; F21K 9/66;
(Continued)

(56) References Cited

U.S. PATENT DOCUMENTS 6,791,180 B2 * 9/2004 Kitamura ................ H01L 23/15
257/701
9,945,542 B2 * 4/2018 Evitt ...................... F21V 19/003
(Continued)

FOREIGN PATENT DOCUMENTS

EP 1345480 A2 9/2003
EP 2487410 A1 8/2012
(Continued)

*Primary Examiner* — Sean P Gramling
*Assistant Examiner* — Keith G. Delahoussaye
(74) *Attorney, Agent, or Firm* — Akarsh P. Belagodu

(57) ABSTRACT

A method for manufacturing an assembly (10) is disclosed. The assembly (10) comprises a substrate (1) having a first surface (3) and a second surface (4). The substrate (1) is at least partially plastically deformable. The assembly (10) comprises a supporting surface (5) arranged to support at least a portion of the second surface (4). The substrate (1) is plastically deformed, thereby producing an elastic preload in at least a portion of the substrate (1). The substrate (1) is fixedly arranged in the assembly (10) such that the second surface (4) is placed against the supporting surface (5), (Continued)

wherein the elastic preload in the at least a portion of the substrate (1) produces a force between the at least a portion of the second surface (4) and the supporting surface (5), whereby the at least a portion of the second surface (4) becomes in abutment with the supporting surface (5) over the at least a portion of the second surface (4). A light source comprising the assembly (10) is also disclosed.

13 Claims, 3 Drawing Sheets

(51) Int. Cl.
*F21K 9/90* (2016.01)
*H05K 3/00* (2006.01)
*F21Y 115/10* (2016.01)

(52) U.S. Cl.
CPC . *H05K 3/0061* (2013.01); *H05K 2201/10106* (2013.01)

(58) Field of Classification Search
CPC ....... H05K 3/0061; H05K 2201/10106; H05K 1/028; H05K 1/0281; F21V 17/10
See application file for complete search history.

(56) References Cited

U.S. PATENT DOCUMENTS

| | | | |
|---|---|---|---|
| 2005/0074638 A1* | 4/2005 | Neubert | B32B 18/00 428/701 |
| 2005/0158687 A1 | 7/2005 | Dahm | |
| 2009/0002973 A1 | 1/2009 | Abe | |
| 2010/0127139 A1 | 5/2010 | Bauer | |
| 2010/0165657 A1* | 7/2010 | Lee | H05K 1/028 362/602 |
| 2010/0177532 A1 | 7/2010 | Ivey | |
| 2010/0220469 A1 | 9/2010 | Ivey et al. | |
| 2010/0328947 A1* | 12/2010 | Chang | F21V 19/0045 362/249.02 |
| 2011/0038146 A1 | 2/2011 | Chen | |
| 2011/0315956 A1 | 12/2011 | Ashdown | |
| 2012/0069556 A1* | 3/2012 | Bertram | F21V 23/02 362/217.14 |
| 2012/0176785 A1 | 7/2012 | Hsu | |
| 2012/0201023 A1* | 8/2012 | Yoneda | F21V 15/013 362/218 |
| 2013/0033888 A1* | 2/2013 | Van Der Wel | F21V 3/06 362/555 |

FOREIGN PATENT DOCUMENTS

| | | |
|---|---|---|
| WO | WO20132018177 A1 | 2/2013 |
| WO | WO2013102823 A1 | 7/2013 |

* cited by examiner

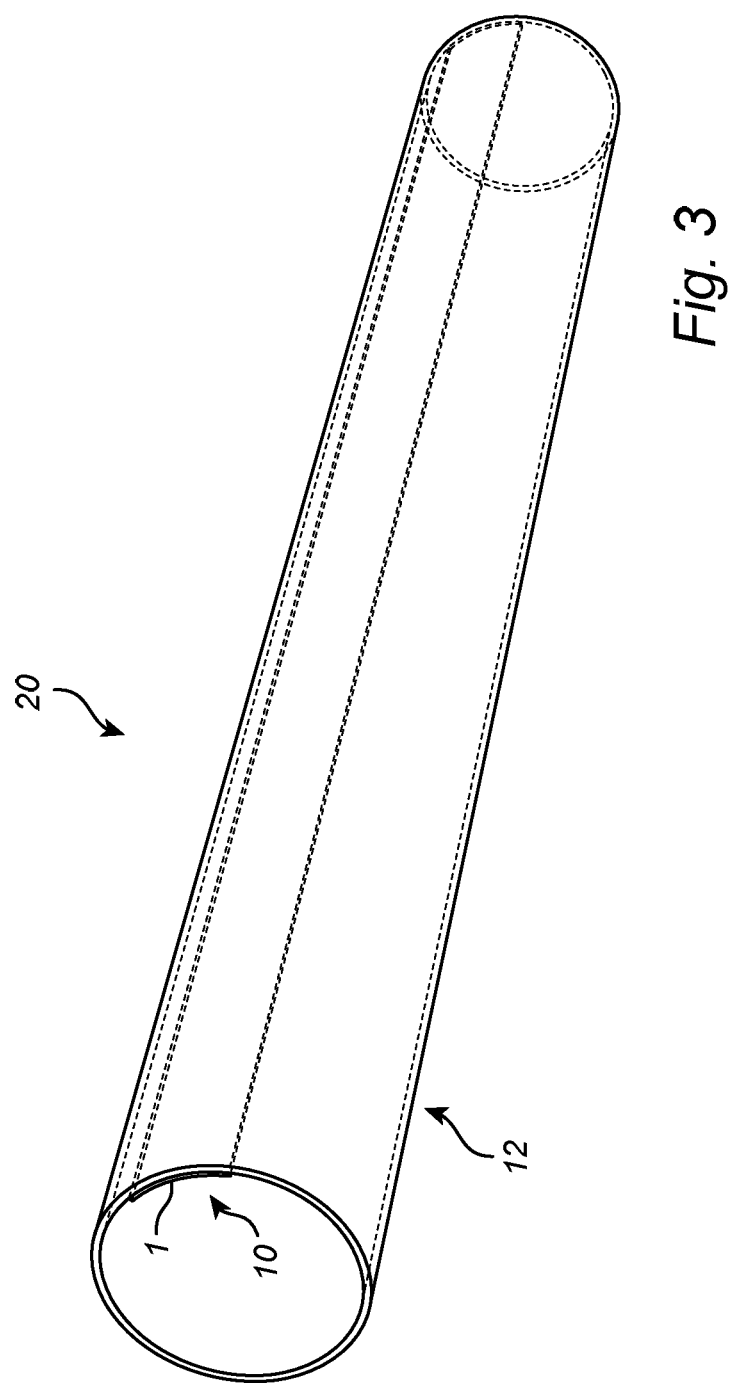

TUBULAR LIGHTING ASSEMBLY WITH ELASTIC ELONGATED SUBSTRATE AND METHOD OF MANUFACTURING A TUBULAR LIGHTING ASSEMBLY WITH ELASTIC ELONGATED SUBSTRATE

CROSS-REFERENCE TO PRIOR APPLICATIONS

This application is the U.S. National Phase application under 35 U.S.C. § 371 of International Application No. PCT/EP2014/072584, filed on Oct. 22, 2014, which claims the benefit of European Application No. 13191507.6, filed on Nov. 5, 2013. These applications are hereby incorporated by reference herein.

FIELD OF THE INVENTION

The present invention relates to a method for manufacturing an assembly comprising a substrate, which substrate is at least partially plastically deformable and adapted to couple at least one electrical component to a first surface of the substrate, and which assembly further comprises a supporting surface arranged to support at least a portion of the second surface of the substrate. The present invention further relates to such an assembly, and a light source comprising such an assembly, which light source e.g. may comprise or constitute a retrofit tube.

BACKGROUND OF THE INVENTION

Fluorescent tubes, or fluorescent lamps, e.g. low pressure mercury-vapor gas-discharge lamps that utilize fluorescence in order to produce visible light, are used in a variety of lighting applications and are usually capable of providing longer lifetime and increased luminous efficiency as compared to, e.g., incandescent lamps. However, when seeking to reduce power consumption of light sources or luminaries, it is desirable to replace conventional light tubes with more energy usage efficient alternatives. One such alternative is light-emitting diode (LED) tubular light sources or lamps, which may have a plurality of LEDs arranged on a strip inside a tube similar to the tube of a fluorescent tube or lamp. Such LED tubular light sources may also be referred to as retrofit tubes.

In such retrofit tubes, as well as in substantially all electrical devices such as high-power semiconductor devices, high-power lasers, microprocessors and/or LEDs, operation is often associated with generation of heat. The heat is a by-product that may have a detrimental effect on performance and lifetime of the devices. Effective cooling is therefore desired or even required in many applications, and thermal performance of the devices, e.g. the capacity and/or efficiency of transferring or dissipating heat away from the devices, is in general an important design parameter. US2012/0069556 A1 discloses an illumination module that includes at least one flexible carrier for a plurality of heat sources, including light sources, wherein the carrier is provided for being bent over at least part of its width.

SUMMARY OF THE INVENTION

For example in retrofit tubes, a light-emitting diode (LED) strip, or LED base plate, may be arranged or mounted on the inner surface of a tube, or tubular body, e.g. made of a light transmissive material such as glass. Since an air gap between two objects may provide for a relatively good thermal insulation between the objects, it is generally desired or even required to avoid or reduce occurrence of any air gap between the LED strip and the inner surface of the tube, which air gap may result in an undesired degree or extent of thermal contact resistance between the LED strip and the inner surface of the tube, in order to comply with thermal performance requirements or desires. Often glue, tape or the like is used when arranging or mounting the LED strip on the inner surface of the tube in order to avoid or reduce occurrence of any air gap between the LED strip and the inner surface of the tube. Another fluid or solid interstitial medium between the contacting surfaces of the LED strip and the tube, e.g. thermal grease, epoxy, pad, or a gap filler, may in addition or in alternative be used. However, such use of glue or tape or the like may result in a complex manufacturing process of retrofit tubes. In case of a glued connection between the LED strip and the inner surface of the tube, lifetime of the device may deteriorate due to thermal cycling, e.g. switching on and off the lamp, which may cause shear stresses between the LED strip and the inner surface of the tube. This may be particularly true for a glued connection between elongated members, as may be the case for example in retrofit tubes.

In addition to or instead of an air gap between objects, thermal contact resistance may occur due to voids created by surface roughness effects, defects and misalignment of the interface between the object, which may reduce the performance of heat transfer between the objects via the interface between the objects. Thus, in electric devices (which are not restricted to lighting applications, e.g. retrofit tubes) it may therefore be desired or even required to have a relatively good thermal contact substantially over the whole interface between two objects coupled to each other, for example for elongated members coupled to each other, as may be the case for example in retrofit tubes. At the same time it may be desirable with an alternative way of coupling two objects together other than by gluing the objects to each other, as discussed above.

With further reference to the example of retrofit tubes, or linear tubular lamp (TL) tubes, during mass production thereof, e.g. in assembly lines, the application of glue or tape in the inside of tubes, which may be relatively long and/or narrow, may be difficult or even infeasible.

In view of the above, a concern of the present invention is to provide a method for manufacturing an assembly, which comprises a substrate that is adapted to couple at least one electrical component to a first surface of the substrate, and which assembly further comprises a supporting surface arranged to support at least a portion of a second surface of the substrate, which method facilitates or allows for achieving a coupling between the supporting surface and the at least a portion of the second surface of the substrate such that the at least a portion of the second surface is relatively close to the supporting surface over the at least a portion of the second surface.

A further concern of the present invention is to provide a method for manufacturing an assembly, which comprises a substrate that is adapted to couple at least one electrical component to a first surface of the substrate, and which assembly further comprises a supporting surface arranged to support at least a portion of a second surface of the substrate, which method facilitates or allows for achieving a relatively good thermal contact between the supporting surface and the at least a portion of the second surface of the substrate over the at least a portion of the second surface.

A further concern of the present invention is to provide a method for manufacturing an assembly, which comprises a substrate that is adapted to couple at least one electrical component to a first surface of the substrate, and which assembly further comprises a supporting surface arranged to support at least a portion of a second surface of the substrate, which method facilitates or allows for achieving a coupling between the supporting surface and the at least a portion of the second surface of the substrate such that the at least a portion of the second surface is relatively close to the supporting surface over the at least a portion of the second surface, without requiring a glued connection or the like between the supporting surface and the at least a portion of the second surface of the substrate.

A further concern of the present invention is to provide a method for manufacturing an assembly, which comprises a substrate that is adapted to couple at least one electrical component to a first surface of the substrate, and which assembly further comprises a supporting surface arranged to support at least a portion of a second surface of the substrate, which method facilitates or allows for achieving a relatively good thermal contact between the supporting surface and the at least a portion of the second surface of the substrate over the at least a portion of the second surface, without requiring a glued connection or the like between the supporting surface and the at least a portion of the second surface of the substrate.

A further concern of the present invention is to provide a method for manufacturing an assembly, which comprises a substrate that is adapted to couple at least one electrical component to a first surface of the substrate, and which assembly further comprises a supporting surface arranged to support at least a portion of a second surface of the substrate, which method facilitates or allows for a decreased complexity and/or difficulty in the manufacturing process as compared to known methods.

A further concern of the present invention is to provide an assembly, which comprises a substrate that is adapted to couple at least one electrical component to a first surface of the substrate, and which assembly further comprises a supporting surface arranged to support at least a portion of a second surface of the substrate, which assembly allows for reducing or even eliminating stresses between the substrate and the supporting surface caused by thermal cycling of the at least one electrical component, e.g. by switching it on and off To address at least one of these concerns and other concerns, a method for manufacturing an assembly and an assembly in accordance with the independent claims are provided. Preferred embodiments are defined by the dependent claims.

According to a first aspect, there is provided a method for manufacturing an assembly, which assembly comprises a substrate having (at least) a first surface and a second surface, wherein the substrate is at least partially plastically deformable and adapted to couple at least one electrical component to the first surface. The assembly further comprises a supporting surface arranged to support at least a portion of the second surface. The method comprises plastically deforming the substrate, thereby producing an elastic preload in at least a portion of the substrate. The substrate is fixedly arranged in the assembly such that the second surface is placed against the supporting surface, wherein the elastic preload in the at least a portion of the substrate produces a force between the at least a portion of the second surface and the supporting surface, whereby the at least a portion of the second surface becomes in abutment with the supporting surface over the at least a portion of the second surface.

By plastically deforming the substrate so as to produce an elastic preload in at least a portion of the substrate before fixedly arranging the substrate in the assembly such that the second surface is placed against the supporting surface, a coupling between the supporting surface and the at least a portion of the second surface of the substrate can be achieved such that the at least a portion of the second surface is relatively close or adjacent to the supporting surface over the at least a portion of the second surface. This may allow for or facilitate achieving a relatively good thermal contact between the supporting surface and the at least a portion of the second surface of the substrate over the at least a portion of the second surface, by reducing or even eliminating thermal contact resistance between the supporting surface and the at least a portion of the second surface of the substrate, for example by avoiding or reducing occurrence of any air gap between the supporting surface and the at least a portion of the second surface of the substrate over the at least a portion of the second surface. This may be achieved without requiring a glued connection or the like between the supporting surface and the at least a portion of the second surface of the substrate, since by the elastic preload in the at least a portion of the substrate a force between the at least a portion of the second surface and the supporting surface may be produced such that the at least a portion of the second surface becomes in abutment, or substantially in abutment, with the supporting surface over the at least a portion of the second surface when the substrate is fixedly arranged in the assembly. Since need of coupling means such as glue or tape or the like for providing the coupling between the supporting surface and the at least a portion of the second surface of the substrate may be reduced or even eliminated, a decreased complexity and/or difficulty in the manufacturing of the assembly as compared to known methods may be achieved. Further, since there may be a reduced or even no need for coupling means such as glue or tape or the like for providing the coupling between the supporting surface and the at least a portion of the second surface of the substrate, separation of the supporting surface from the substrate, or vice versa, at the end of the assembly's life-time may be relatively easy. Further, by the provisioning of an elastic preload in the at least a portion of the substrate such that a force between the at least a portion of the second surface and the supporting surface is produced for coupling the supporting surface to the at least a portion of the second surface of the substrate, or vice versa, the said coupling may be independent or substantially independent of geometric tolerances of the components included in the assembly, such as geometric tolerances of the substrate and the element(s) or member(s) on which the supporting surface is located. Since there may be a reduced or even no need for coupling means such as glue or tape or the like for providing the coupling between the supporting surface and the at least a portion of the second surface of the substrate, any stresses, e.g. shear stresses, between the substrate and the supporting surface caused by thermal cycling of the at least one electrical component, e.g. by switching it on and off, may be reduced or even eliminated.

Neither the second surface nor the supporting surface need to be flat or smooth. Rather, one or both of them may be non-flat and/or non-smooth, i.e. exhibit a certain degree of surface roughness.

The arrangement of the first and second surfaces relatively to each other may depend on the construction or configuration of the substrate. For example where the substrate is an elongated substrate which has a shape similar to a strip-like substrate or layer structure, the first surface and the second surface may be arranged opposite or substantially opposite with respect to each other, e.g. on oppositely located sides of the elongated substrate. However, other configurations of the substrate, and arrangements of the first surface relatively to the second surface, are possible.

In the context of the present application, by plastically it is meant for example an ability to retain a shape attained by deformation. Hence, the substrate may be arranged so as to be capable of (at least momentarily) retaining a shape attained by deformation of the substrate.

The substrate may for example be an elongated substrate, i.e. have an elongated shape.

In the context of the present application, by the term "elongated" it is meant a member or element, such as a substrate, which has a length along a longitudinal axis that is relatively large in comparison to a width of the member or element. For example with respect to an elongated substrate, the elongated substrate may for example have a shape in accordance with a strip-like substrate or layer structure, but is not limited to such a shape.

In general, in the context of the present application it is meant by the term "substrate" in principle any unit, member or element suitable for mechanically supporting and possibly electrically connecting electrical or electronic components using conductive pathways, such as high-power semiconductor devices, microprocessors, light-emitting diodes (LEDs) and other devices that may generate heat during their operation and for which it may be required or desired to transfer and/or dissipate heat generated during their operation. The substrate may for example comprise at least one piece of sheet metal.

For example in case the substrate is an elongated substrate, i.e. has an elongated shape, the plastic deformation of the substrate may for example comprise plastically deforming the substrate such that at least a portion of the second surface curves outwards at least longitudinally, e.g. by means of bending at least one portion of the substrate, and/or by means of forming a plurality of indentations on the second surface along a selected direction or path on the second surface. The selected direction may be defined by a straight or curved path, or a path including both straight and curved sections, on the second surface.

The plurality of indentations may be formed at spaced locations, i.e. at locations separated by some distance, on the second surface along a selected direction or path on the second surface. The distance between the spaced locations may be the same along the selected direction or path. However, according to another embodiment of the present invention, the distance between the spaced locations may vary along the selected direction or path. The plurality of indentations may for example be formed by means of doming, stamping, pressing, and/or ball/rod indentation.

However, the manner of plastic deformation of the substrate such that at least a portion of the second surface curves outwards at least longitudinally is not limited to forming a plurality of indentations or recesses on the second surface along a selected direction or path on the second surface. Rather, plastic deformation of the substrate so as to achieve a desired or required curvature of at least a portion of the substrate such that an elastic preload in at least a portion of the substrate is produced may be realized or facilitated in a number of different ways, which elastic preload, when the substrate is fixedly arranged in the assembly such that the second surface is placed against the supporting surface, produces a force between the at least a portion of the second surface and the supporting surface. Plastic deformation of the substrate may be carried out prior to arranging the substrate in the assembly ("preshaping"), during arranging the substrate in the assembly ("operational shaping"), and/or after arranging the substrate in the assembly ("postshaping"). It is also contemplated that, in addition or in alternative, plastic deformation of the substrate such that at least a portion of the second surface curves outwards at least longitudinally may be achieved or facilitated by means of act(s) performed on the first surface.

According to non-limiting examples, plastic deformation of the substrate, whereby an elastic preload in at least a portion of the substrate is produced, may be carried out by means of continuous deformation of the substrate by sheared rolling, e.g. by means of a so called English wheel or Wheeling machine or the like, by means of a curved mold and/or stamp or the like, by means of flame deformation (e.g. by relatively quickly heating the substrate in one or more localized areas or regions using a relatively hot flame), by means of stamping or pressing (e.g., dome-stamping or bulging), and/or by means of spot welding and/or riveting. According to another non-limiting example, plastic deformation of the substrate, whereby an elastic preload in at least a portion of the substrate is produced, may be carried out by means of by means of local or continuous bi-metallic action, with the substrate comprising e.g. a portion of one material on to or below a portion of another, different material, with the different materials having different coefficients of thermal expansion, or the substrate comprising two strips of two different materials, e.g. metals, which expand at different rates as they are heated. According to another non-limiting example, in case the substrate comprises e.g. a duplex or triplex laminate or the like where the layers may be of the same or different materials, plastic deformation of the substrate may be carried out by bonding the layers together in such a way that such that at least a portion of the second surface curves outwards at least longitudinally in an appropriate manner so as to produce an elastic preload in at least a portion of the substrate. Plastic deformation of the substrate according to any one of these examples may realize, facilitate or enable that at least a portion of the second surface curves outwards at least longitudinally similarly or substantially similarly to as when plastically deforming the substrate by means of forming a plurality of indentations on the second surface along a selected direction or path on the second surface.

According to another example the substrate may for example comprise a plurality of regions arranged at spaced locations. Each of the regions may comprise material having a coefficient of thermal expansion which differs from a coefficient of thermal expansion of material neighboring the region. A substrate with such regions may for example be formed by making holes or recesses in a substrate of a first material, e.g. by means of punching, and filling or inserting second material into the holes or recesses, which first material and second material may have different coefficients of thermal expansion. The plurality of regions may be arranged at spaced locations along a selected direction or path.

Plastically deforming the substrate such that at least a portion of the second surface curves outwards at least longitudinally may for example comprise heating the substrate, possibly locally and e.g. using a relatively hot flame and/or an optical radiation source such as a laser, such that material of at least one of the regions changes in size to a different extent compared to material neighboring the at least one of the regions. Material of at least one of the regions may change in size to a different extent compared to material neighboring the at least one of the regions due to the difference in coefficients of thermal expansion of the material of the at least one of the regions and the material neighboring the at least one of the regions.

The substrate may for example comprise a plurality of layers arranged in a stack such that neighboring layers are coupled with each other.

The neighboring layers may be coupled with each other at least at spaced locations. The coupling between neighboring layers may be continuous over at least a portion of the contacting surfaces of respective ones of neighboring layers, and/or at least in part be of local nature, e.g. including mechanical fasteners such as rivets arranged at selected locations in the substrate. The spaced and/or selected locations may be situated along a selected direction or path. According to an example, the plurality of layers may be laminated to each other. The plurality of layers may be arranged on top of each other so as to form a stack.

Each of the layers may comprise material having a coefficient of thermal expansion which differs from a coefficient of thermal expansion of material of at least a neighboring layer.

Plastically deforming the substrate such that at least a portion of the second surface curves outwards at least longitudinally may for example comprise heating the substrate such that material of at least one of the layers changes in size to a different extent compared to material of a layer neighboring the at least one of the layers. The heating of the substrate may for example be carried out at least in part by means of heat generated by operation of electrical component(s) coupled to the first surface of the substrate. In alternative or in addition, the heating of the substrate may for example be carried out by means of a suitable heating apparatus known in the art, which may be controllable with respect to e.g. the amount of heat output by the apparatus.

The assembly and/or the substrate may for example comprise at least one circuit board, e.g. a flexible circuit board such as a flexible printed circuit board (PCB), adapted to support the at least one electrical component.

The substrate may comprise or be constituted by at least one heat transferring and/or dissipating member, e.g. a heat sink and/or a heat spreader, which may be elongated, i.e. have an elongated shape.

According to another example, the assembly and/or the substrate may comprise at least one PCB, such as, e.g., a ceramic PCB comprising alumina, which may provide mechanical support and electrical connections for electrical components, e.g. including one or more light-emitting elements, coupled to the first surface of the substrate. In alternative or in addition, the assembly and/or the substrate may comprise a leadframe.

The substrate may for example comprise a ceramic or polymeric material, and may have a relatively high thermal conductivity to enable a good heat performance, or cooling, of electrical components such as light-emitting elements coupled to, or provided on, the first surface of the substrate.

The fixedly arranging of the substrate in the assembly such that the second surface is placed against the supporting surface may for example comprise pressing the substrate such that the second surface is pressed against the supporting surface over the second surface.

In alternative or in addition, fixedly arranging the substrate in the assembly such that the second surface is placed against the supporting surface may for example comprise clamping and/or fixing the substrate in two opposite ends thereof. For example for a case where the assembly is included in a light source such as a retrofit tube or linear TL tube, wherein the assembly comprises a tubular body, which may be hollow, having an inner surface and wherein the supporting surface in the assembly is constituted at least in part by the inner surface, fixedly arranging the substrate in the assembly may comprise clamping and/or fixing the substrate in two opposite ends thereof by means of connection means such as contact pins or the like in the respective ends such as found in conventional fluorescent tubes or lamps.

According to a second aspect, there is provided an assembly, comprising a substrate having (at least) a first surface and a second surface. The substrate is at least partially plastically deformable, and is adapted to couple at least one electrical component to the first surface. The assembly comprises a supporting surface which is arranged to support at least a portion of the second surface. The substrate is fixedly arranged in the assembly such that the second surface is placed against the supporting surface. The substrate is arranged such that, by means of it being plastically deformable, there is an elastic preload in at least a portion of the substrate, which elastic preload produces a force between the at least a portion of the second surface and the supporting surface, whereby the at least a portion of the second surface is in abutment with the supporting surface over the at least a portion of the second surface.

The elastic preload may for example have been produced by the substrate having been plastically deformed such that at least a portion of the second surface curves outwards at least longitudinally, e.g. such as described in the foregoing, prior to the substrate being fixedly arranged in the assembly.

The assembly may for example comprise a tubular body, which may be hollow. The tubular body may have an inner surface.

The supporting surface in the assembly may be constituted at least in part by the inner surface.

The tubular body may for example comprise a light transmissive material, such as, but not limited to, a glass, poly(methyl methacrylate), PMMA, or any combination thereof.

According to an example, the substrate may comprise a light reflecting region arranged to reflect at least part of the light generated or emitted by light-emitting elements provided thereon (e.g. on the first surface of the substrate), and/or a phosphor layer (or volume) arranged to convert at least part of the emitted light to other colors.

In the following description, exemplifying embodiments of the present invention is described mainly with reference to an assembly comprising a substrate having a first surface to which at least one electrical component in the form of at least one LED can be coupled, with the assembly being used in a lighting application. However, it is to be understood that the present invention is not limited to lighting applications but may be used in a number of different applications where it is desired or even required to have a relatively good thermal contact substantially over the whole interface between two objects coupled to each other, for example for elongated members coupled to each other.

The number of electrical components coupled to the substrate may in principle be any positive integer.

The at least one (e.g., flexible) circuit board may be coupled to the at least one heat transferring and/or dissipating member.

According to a non-limiting example, the electrical component includes at least one light-emitting element, e.g. including or being constituted by at least one LED. However, in the context of the present application, the term "light-emitting element" is used to define substantially any device or element that is capable of emitting radiation in any region or combination of regions of the electromagnetic spectrum, for example the visible region, the infrared region, and/or the ultraviolet region, when activated e.g. by applying a potential difference across it or passing a current through it. Therefore a light source can have monochromatic, quasi-monochromatic, polychromatic or broadband spectral emission characteristics. Examples of light sources include semiconductor, organic, or polymer/polymeric LEDs, blue LEDs, optically pumped phosphor coated LEDs, optically pumped nano-crystal LEDs or any other similar devices. The light-emitting element(s) may be provided on the (first surface of the) substrate such that an electrical connection is provided between the substrate and the light-emitting element(s).

A LED could be used as naked die, or packaged, i.e. as a LED package. Here, a LED package may refer to LED(s) with protective coating or some kind of mechanical reinforcement, and not primarily to LED(s) with unprotected downward facing leads that are to be soldered or surface mounted directly to a substrate. However, the light-emitting element may in addition or in alternative be provided in the form of at least one LED arranged on a naked die (without a dedicated protective coating). A LED may be a multi-color LED, a single-color LED, a phosphor LED, and/or an organic light emitting diode (OLED), etc.

According to a third aspect, there is provided a light source comprising an assembly according to the second aspect.

The light source may for example include or be constituted by a retrofit tube, wherein the assembly may comprise a tubular body having an inner surface and wherein the supporting surface in the assembly can be constituted at least in part by the inner surface. The tubular body may for example comprise a light transmissive material, such as, but not limited to, a glass or the like, and/or another material which allows for transmission of light therethrough, e.g. with or without scattering.

The light source may comprise at least one light-emitting element, adapted to emit light, coupled to the first surface of the substrate.

The light source may be a linear TL tube.

Further objects and advantages of the present invention are described in the following by means of exemplifying embodiments.

It is noted that the present invention relates to all possible combinations of features recited in the claims. Further features of, and advantages with, the present invention will become apparent when studying the appended claims and the following description. Those skilled in the art realize that different features of the present invention can be combined to create embodiments other than those described in the following.

BRIEF DESCRIPTION OF THE DRAWINGS

Exemplifying embodiments of the invention will be described below with reference to the accompanying drawings.

FIG. 1 shows side views of (portions of) the assembly at different stages during the manufacturing method.

FIG. 3 is a perspective view of the light source depicted in FIG. 2.

In the accompanying drawings, the same reference numerals denote the same or similar elements throughout the views.

DETAILED DESCRIPTION

The present invention will now be described hereinafter with reference to the accompanying drawings, in which exemplifying embodiments of the present invention are shown. The present invention may, however, be embodied in many different forms and should not be construed as limited to the embodiments set forth herein; rather, these embodiments are provided by way of example so that this disclosure will convey the scope of the invention to those skilled in the art. The steps of any method disclosed herein do not have to be performed in the exact order as disclosed, unless explicitly stated so. Furthermore, like numbers refer to the same or similar elements or components throughout.

Figure 1:
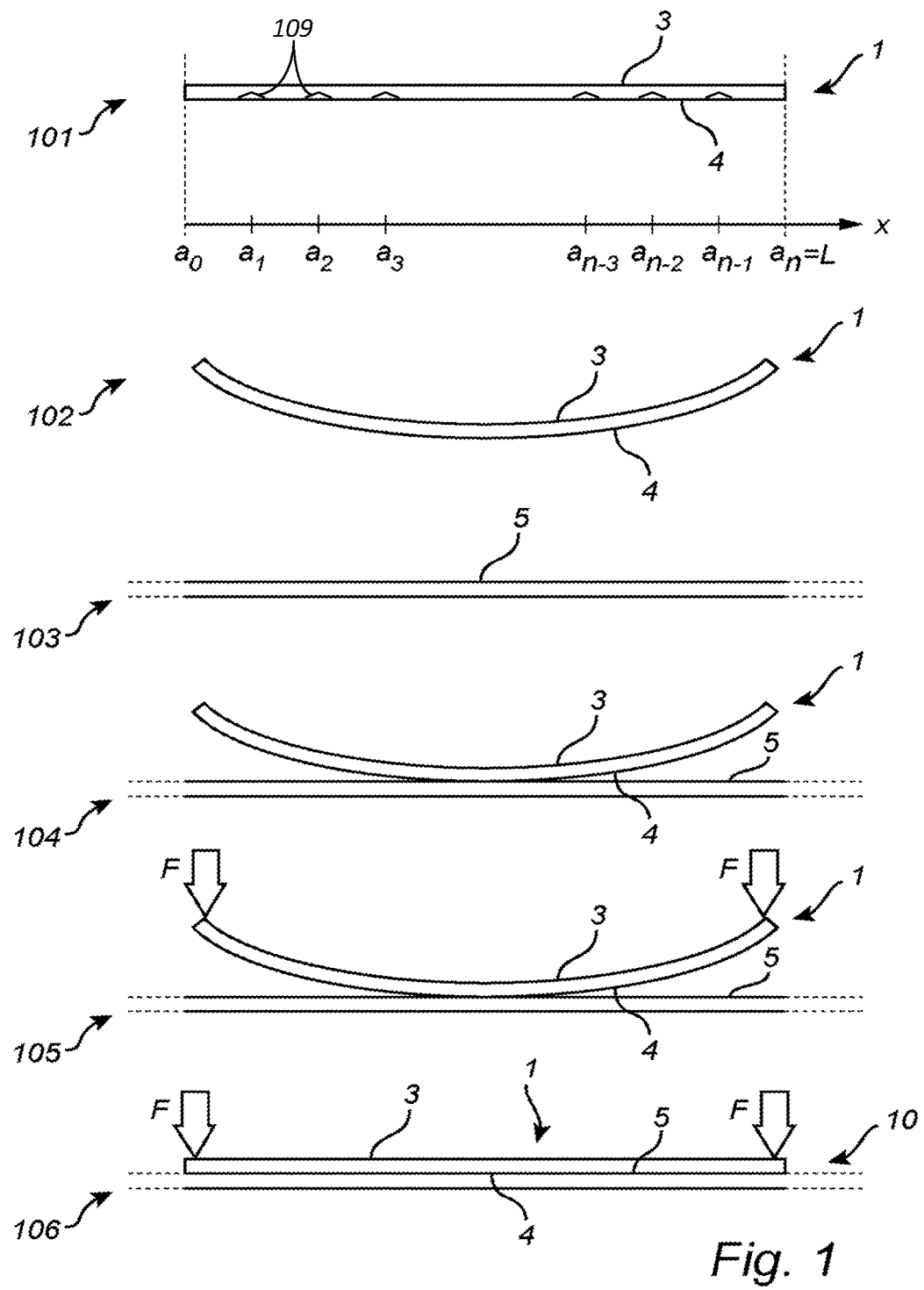
FIG. 1 illustrates a general outline of steps of a method of manufacturing an assembly in accordance with an embodiment of the present invention.

With reference to FIG. 1, there is illustrated a general outline of a method of manufacturing an assembly 10 in accordance with an embodiment of the present invention. FIG. 1 shows side views of (portions of) the assembly 10 at different stages during the manufacturing method. As further described in the following, the assembly 10 comprises an elongated substrate 1, which has a first surface 3 and a second surface 4. The assembly 10 further comprises a supporting surface 5 arranged to support at least a portion of the second surface 4. Other shapes of the substrate 1 are possible. It is not necessary for the substrate 1 to have an elongated shape.

At 101, an elongated substrate 1 is provided. According to the embodiment illustrated in FIG. 1, the elongated substrate 1 is constituted by an elongated heat transferring and/or dissipating member, e.g. a heat sink and/or a heat spreader, made of a material having a relatively high thermal conductivity, for example based on or comprising at least one metal, such as Al, or a metallic alloy, e.g. based on or including Al. In this regard, the term "based on" indicates that the material of the elongated heat transferring and/or dissipating member substantially includes e.g. a metal or an alloy thereof, but does however not exclude the presence of amounts of (remaining) other material(s), which amounts may be relatively small. According to the embodiment illustrated in FIG. 1, the elongated substrate 1 comprises a strip-like substrate or layer structure. However, according to embodiments of the present invention, the elongated substrate 1 may in alternative or in addition comprise at least one member or element other than the elongated heat transferring and/or dissipating member.

The elongated substrate 1 has a first surface 3 and a second surface 4. According to the embodiment illustrated in FIG. 1, the first surface 3 and the second surface 4 are arranged opposite or substantially opposite with respect to each other. However, other configurations of the elongated substrate 1, and arrangements of the first surface 3 relatively to the second surface 4, are possible. The elongated substrate 1 has a length L along a longitudinal axis x.

The elongated substrate 1 is at least partially plastically deformable.

At 102, the elongated substrate 1, or one or more parts or portions thereof that are plastically deformable, are plastically deformed so as to produce an elastic preload in at least a portion of the elongated substrate 1. According to the embodiment illustrated in FIG. 1, the plastic deformation of the elongated substrate 1 comprises plastically deforming the elongated substrate 1 such that the second surface 4 curves outwards longitudinally, i.e. outwards with respect to the axis x. This is carried out by forming a plurality of indentations 109 (only two of which are referenced) on the second surface 4 along a selected direction on the second surface 4, e.g. along the axis x. The plurality of indentations 109 may be formed at spaced locations on the second surface 4 along e.g. the axis x. The indentations 109 may for example be formed at $x=a_1$, $x=a_2$, $x=a_3$, ..., $x=a_{n-3}$, $x=a_{n-2}$, and $x=a_{n-1}$. As indicated in FIG. 1, the distance between the spaced locations along the axis x may be substantially the same or the same, i.e. $a_1-a_0=a_2-a_1=a_3-a_2=\ldots=a_{n-2}-a_{n-3}=a_{n-1}-a_{n-2}=a_n-a_{n-1}=\Delta a$, where $\Delta a$ is a predefined distance. However, according to embodiments of the present invention, the distance between the spaced locations along the axis x may vary.

The positions of the plurality of indentations on the second surface 4 may for example be determined by means of modeling the elongated substrate 1 as an elastic string using a wave equation. This may be a reasonable approximation if the elongated substrate 1 has a length that is much larger than a width of the elongated substrate 1. With reference to FIG. 1, the wave equation may for example concern a time variable t, the spatial variable x depicted in FIG. 1, and a scalar function $u=u(x, t)$ which represents the shape of the elastic string (elongated substrate 1) in the u-x plane at time instant t. Hence, $u(x, t)$ may represent the instantaneous position of the elastic string at position x. Furthermore, the spatial derivative of u, $du/dx$, provides an angle of the elastic string (elongated substrate 1) at each position x. By forming a plurality of indentations on the second surface 4 along the axis x, the elongated substrate 1 will attain a shape similar to a quasi-continuous curve in the u-x plane. Hence, a desired shape of the elongated substrate 1 can be approximately achieved by determining positions of where to form or create a plurality of indentations along the axis x such that the plastically deformed elongated substrate 1 approximately exhibits the desired shape in the u-x plane, and which positions are determined by means of determining $du/dx$, by means of modeling of the elongated substrate 1 as an elastic string. In case the elongated substrate 1 would have a larger width, it is contemplated that the elongated substrate 1 could be modeled as an elastic sheet, with the positions of the plurality of indentations on the second surface 4 determined similarly to as when modeling the elongated substrate 1 as an elastic string.

For example by means of the forming of the indentations on the second surface 4 the at least one portion of the elongated substrate 1 may be bent, as illustrated at 102.

At 103, a supporting surface 5 is provided. The supporting surface 5 is arranged to support the second surface 4.

The elongated substrate 1 is fixedly arranged in the assembly 10 such that the second surface 4 is placed against the supporting surface 5, wherein the elastic preload in the at least a portion of the elongated substrate 1 produces a force between the at least a portion of the second surface 4 and the supporting surface 5, or a load towards the supporting surface 5 which is distributed evenly or substantially evenly over the whole or substantially the whole of the second surface 4, whereby the at least a portion of the second surface 4 becomes in abutment with the supporting surface 5 over the at least a portion of the second surface 4.

The fixedly arranging of the elongated substrate 1 in the assembly 10 is illustrated by way of example at 104-106, wherein the elongated substrate 1 is pressed towards the supporting surface 5 by means of a force F applied at ends of the elongated substrate 1 (cf. 105) so that the second surface 4 is placed against the supporting surface 5 (cf. 106). The elastic preload in the at least a portion of the elongated substrate 1 produces a force between the at least a portion of the second surface 4 and the supporting surface 5, such that the at least a portion of the second surface 4 becomes in abutment with the supporting surface 5 over the at least a portion of the second surface 4 (cf. 106).

The elongated substrate 1 is adapted to couple at least one electrical component (not shown in FIG. 1) to the first surface 3. To this end, the assembly 10 may for example comprise a flexible circuit board (not shown in FIG. 1), such as a flexible printed circuit board (PCB) or the like, arranged on the first surface 3, which flexible circuit board may be adapted to support and/or electrically connect the at least one electrical component. The flexible circuit board may for example comprise a flexible insulating elongated substrate on which electric components can be arranged. The flexible circuit board may be coupled to the elongated heat transferring and/or dissipating member or elongated member 1. In alternative, a (possibly flexible) circuit board may be comprised in the elongated substrate 1.

As will be further described in the following with reference to FIG. 2, the assembly 10 may according to exemplifying embodiments of the present invention comprise a tubular body having an inner surface, wherein the supporting surface 5 can be constituted at least in part by the inner surface. Preferably, for an example where the assembly 10 is included in a light source, the tubular body may for example comprises a light transmissive material, and the at least one electrical component coupled to the first surface 3 may for comprise at least one light-emitting element such as a LED.

Figure 2:
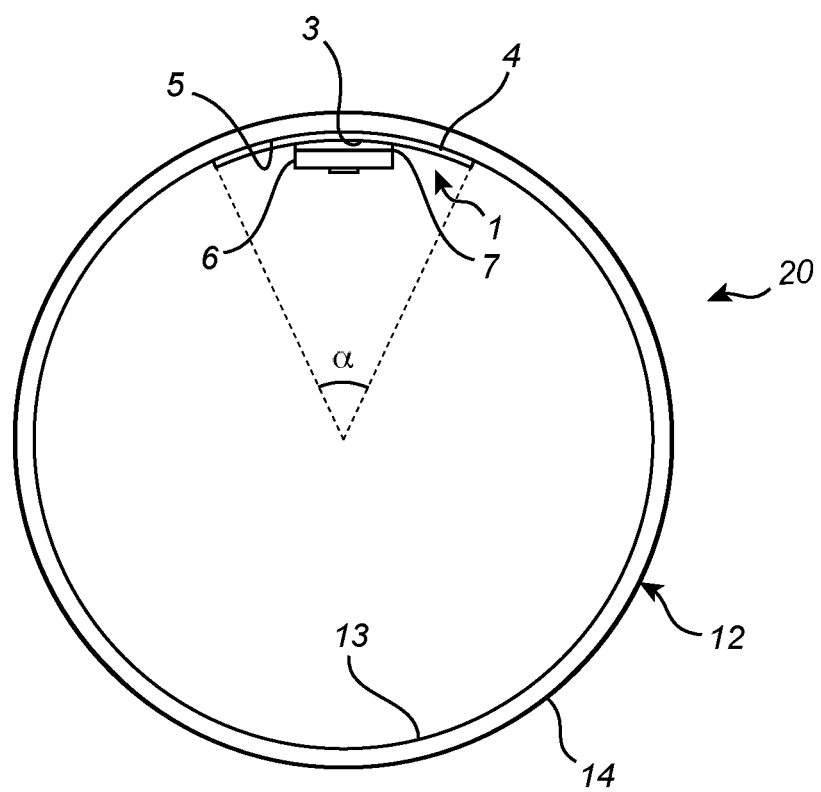
FIG. 2 is a cross-sectional view of a light source according to an embodiment of the present invention.

Referring now to FIG. 2, there is shown a cross-sectional view of (part of) a light source 20 according to an embodiment of the present invention.

The light source 20 comprises a tubular body 12, which for example may comprise a light transmissive material, having an inner surface 13 and an outer surface 14.

The light source 20 comprises an assembly 10 according to an embodiment of the present invention. The assembly 10 comprises an elongated substrate 1 having a first surface 3 and a second surface 4. The elongated substrate 1 is at least partially plastically deformable and adapted to couple at least one electrical component 6 to the first surface 3. In accordance with the embodiment depicted in FIG. 2, coupling of the at least one electrical component 6 to the first surface 3 is achieved by means of a circuit board 7 or the like, e.g. a flexible circuit board, arranged on the first surface 3, which circuit board 7 may be adapted to support and/or electrically connect the at least one electrical component 6. Electrical connections, wirings, etc. to and/or from the at least one electrical component 6 are not shown in FIG. 2.

The elongated substrate 1 may for example comprise an elongated heat transferring and/or dissipating member, such as a heat sink and/or a heat spreader. As indicated in FIG. 2, the circuit board 7 may be coupled to the elongated substrate 1 or elongated heat transferring and/or dissipating member.

In accordance with the embodiment depicted in FIG. 2, the at least one electrical component 6 coupled to the first surface 3 comprises at least one LED. The assembly 10 comprises a supporting surface 5, which, as illustrated in FIG. 2, is constituted in part by the inner surface 13 of the tubular body 12. The supporting surface 5 is arranged to support at least a portion of the second surface 4 thereon. The elongated substrate 1 is fixedly arranged in the assembly 10 such that the second surface 4 is placed against the supporting surface 5. The elongated substrate 1 is arranged, by means of it being at least partially plastically deformable, such that there is an elastic preload in at least a portion of the elongated substrate 1, which elastic preload produces a force between the at least a portion of the second surface 4 and the supporting surface 5, whereby the at least a portion of the second surface 4 is in abutment with the supporting surface 5 over the at least a portion of the second surface 4, such as illustrated in FIG. 2. The elastic preload may for example have been produced or generated by the elongated substrate 1 having been plastically deformed such that at least a portion of the second surface 4 curves outwards at least longitudinally (cf. 102 in FIG. 1) prior to the elongated substrate 1 being fixedly arranged in the assembly 10.

Referring now to FIG. 3, there is shown, for purpose of illustration, a perspective view of the light source 20 depicted in FIG. 2. In FIG. 3, only the elongated substrate 1 of the assembly 10 is depicted, and not other components or elements which may be included in the assembly 10 such as depicted in FIG. 2.

The assembly 10, or the second surface 4 of the elongated substrate 1 of the assembly 10, may cover a selected portion of the inner surface 13 of the tubular body 12.

With further reference to FIGS. 2 and 3, the elongated substrate 1 may have a width equal to or substantially equal to an arc length of a circular sector having a central angle α in a plane perpendicular to an axial direction of the tubular body 12, i.e. equal to a fraction of the circumference of the tubular body 12 defined by the angle α, as illustrated in FIG. 2.

According to embodiments of the present invention, α may be equal to or exceed about 60°. However, α<60° is possible. Generally, the choice of α (i.e. choice of width of the elongated substrate 1) may depend on the number of electrical components which are to be coupled to the first surface 3.

The lighting device 20 may further comprise end caps or the like (not shown in FIG. 3) for closing the tubular body 12. The end caps may be attached or coupled to the respective ends of the tubular body 12, and may thereby seal the inner volume of the tubular body 12. The end caps may in addition or in alternative provide electric connection means, e.g. in form of electrical terminals (not shown in FIG. 3), for electrical connection to an external power source (not shown in FIG. 3). Each electric terminal may be externally accessible in form of a contact pin or some other contact means arranged at the respective end cap.

In conclusion, there is disclosed a method for manufacturing an assembly and an assembly. The assembly comprises a substrate having a first surface and a second surface. The substrate is at least partially plastically deformable. The assembly comprises a supporting surface arranged to support at least a portion of the second surface. The substrate is plastically deformed, thereby producing an elastic preload in at least a portion of the substrate. The substrate is fixedly arranged in the assembly such that the second surface is placed against the supporting surface, wherein the elastic preload in the at least a portion of the substrate produces a force between the at least a portion of the second surface and the supporting surface, whereby the at least a portion of the second surface becomes in abutment with the supporting surface over the at least a portion of the second surface. A light source comprising the assembly is also disclosed.

While the present invention has been illustrated and described in detail in the appended drawings and the foregoing description, such illustration and description are to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. The mere fact that certain measures are recited in mutually different dependent claims does not indicate that a combination of these measures cannot be used to advantage. Any reference signs in the claims should not be construed as limiting the scope.

The invention claimed is:

1. A method for manufacturing an elongated assembly having a tubular body with a central axis and an inner surface, said assembly comprising an elastic elongated substrate having a first surface and a second surface, the substrate being at least partially deformable and adapted to couple at least one electrical component to the first surface, the assembly further comprising a supporting surface constituted at least in part by the inner surface arranged to support at least a portion of the second surface, the method comprising:
    inducing an elastic preload in at least one portion of the elastic elongated substrate by deforming the elastic elongated substrate such that the portion of the second surface curves outwards at least longitudinally;
    inserting the elastic elongated substrate into the tubular body of the assembly; and
    fixedly arranging the elastic elongated substrate in the elongated assembly, wherein the elastic preload in the at least a portion of the elastic elongated substrate produces a force between the at least one portion of the second surface and the supporting surface that abuts the portion of the second surface against the supporting surface, by arranging the substrate in two opposite ends of the tubular body, wherein the elastic preload imposed by the substrate imposes a force to direct the substrate to increase a curvature of the substrate along a direction parallel to the central axis of the tubular body while the substrate is fixedly arranged in the elongated assembly.

2. The method according to claim 1, wherein deforming the elastic elongated substrate comprises bending the at least one portion of the substrate.

3. The method according to claim 1, wherein deforming the elastic elongated substrate comprises forming a plurality of indentations on the second surface along a selected direction or path on the second surface.

4. The method according to claim 3, wherein the plurality of indentations are formed at spaced locations ($a_1$, $a_2$, $a_3$, . . . , $a_{n-3}$, $a_{n-2}$, $a_{n-1}$) on the second surface along the selected direction or path on the second surface.

5. The method according to claim 4, wherein a distance between the spaced locations is determined by modeling the elastic elongated substrate as an elastic string using a wave equation.

6. The method according to claim 4, wherein a distance between the spaced locations varies along the selected direction.

7. An elongated assembly comprising:
    a tubular body with an inner surface;
    an elastic elongated substrate having a first surface and a second surface,
    the substrate being at least partially deformable and adapted to couple at least one electrical component to the first surface; said elastic elongated substrate being arranged in the tubular body;
    a supporting surface constituted at least in part by the inner surface arranged to support the second surface;
    wherein the substrate is fixedly arranged in the elongated assembly, wherein the substrate is configured to be deformable such that there is an elastic preload in at least a portion of the substrate producing a force between the second surface and the supporting surface, whereby the second surface is in abutment with the supporting surface by fixedly arranging the substrate in two opposite ends of the tubular body, wherein the elastic preload imposed by the substrate imposes a force to direct the substrate to increase a curvature of the substrate along a longitudinal axis of the substrate while the substrate is fixedly arranged in the elongated assembly.

8. The assembly according to claim 7, wherein the tubular body comprises a light transmissive material.

9. The assembly according to claim 7, wherein the substrate comprises at least one heat transferring or dissipating member.

10. The assembly according to claim 7, further comprising at least one circuit board adapted to support the at least one electrical component.

11. A light source comprising the assembly according to claim 7.

12. The light source according to claim 11, further comprising end caps for closing the tubular body.

13. The assembly according to claim 7, wherein the substrate in two opposite ends of the tubular body is arranged using contact pins.

* * * * *